United States Patent [19]

Garavaglia et al.

[11] 4,309,241
[45] Jan. 5, 1982

[54] GAS CURTAIN CONTINUOUS CHEMICAL VAPOR DEPOSITION PRODUCTION OF SEMICONDUCTOR BODIES

[75] Inventors: Paul M. Garavaglia, Affton; Henry W. Gutsche, St. Louis, both of Mo.

[73] Assignee: Monsanto Company, St. Louis, Mo.

[21] Appl. No.: 172,503

[22] Filed: Jul. 28, 1980

[51] Int. Cl.³ ............................................. C30B 25/08
[52] U.S. Cl. .................................... 156/613; 156/608;
156/617 SP; 156/620; 118/718; 118/719;
118/720; 422/246; 422/249; 422/250; 427/95;
427/255.2
[58] Field of Search ......................... 156/610, 612–614,
156/DIG. 64, 617 SP, 620, 617 M, 608;
422/246, 249, 250; 148/175; 75/65 ZM;
13/DIG. 1; 423/349, 350; 118/715, 718, 720,
719, 725; 427/86, 95, 248.1, 255.2, 255.5

[56] References Cited

U.S. PATENT DOCUMENTS

| | | | |
|---|---|---|---|
| 3,011,877 | 12/1961 | Schweickert et al. | 423/349 |
| 3,036,892 | 5/1962 | Siebertz | 423/349 |
| 3,146,123 | 8/1964 | Bischoff et al. | 427/95 |
| 3,147,141 | 9/1964 | Ishizvica | 423/349 |
| 3,341,376 | 9/1967 | Sperke et al. | 156/613 |
| 3,496,037 | 2/1970 | Jackson, Jr. et al. | 156/613 |
| 3,508,962 | 4/1970 | Manasevit et al. | 156/613 |
| 3,969,163 | 7/1976 | Wakefield | 156/613 |
| 4,147,814 | 4/1979 | Yatsurugi et al. | 423/349 |

OTHER PUBLICATIONS

*Solid State Technology*, Jul. 1977, "Automation in CVD Processing" by Richard Rosler and Walter Benzing, pp. 27–33.

*Primary Examiner*—Gregory N. Clements
*Attorney, Agent, or Firm*—Henry Croskell

[57] ABSTRACT

Apparatus and process for producing electronic-grade semiconductor bodies are disclosed wherein continuously-pulled slim rod which can be formed in situ from the reaction of a seed crystal and a molten semiconductor material source, is pulled into and through a chemical vapor deposition chamber, having a gas curtain along the inner wall, the slim rod surface being preheated before entry into the deposition chamber where it is simultaneously exposed to focused heating and thermally decomposable gaseous compounds in order to provide suitable surface reaction conditions on the slim rod for the decomposition of the gaseous compounds which results in deposition growth upon the surface of the rod. Single crystal semiconductor bodies are produced according to the process by avoiding poly-growth conditions through the in situ continuously pulled virgin slim rod, preheating of the slim rod for entry into the chemical vapor deposition chamber wherein the rod is simultaneously heated or maintained at reaction temperature conditions while being exposed or contacted with elected thermally decomposable gaseous compounds and continuously drawn through the chemical vapor deposition chamber reaction zone resulting in an enlarged single crystal semiconductor body which is withdrawn continuously from the chemical vapor deposition chamber.

28 Claims, 1 Drawing Figure

U.S. Patent  Jan. 5, 1982  4,309,241
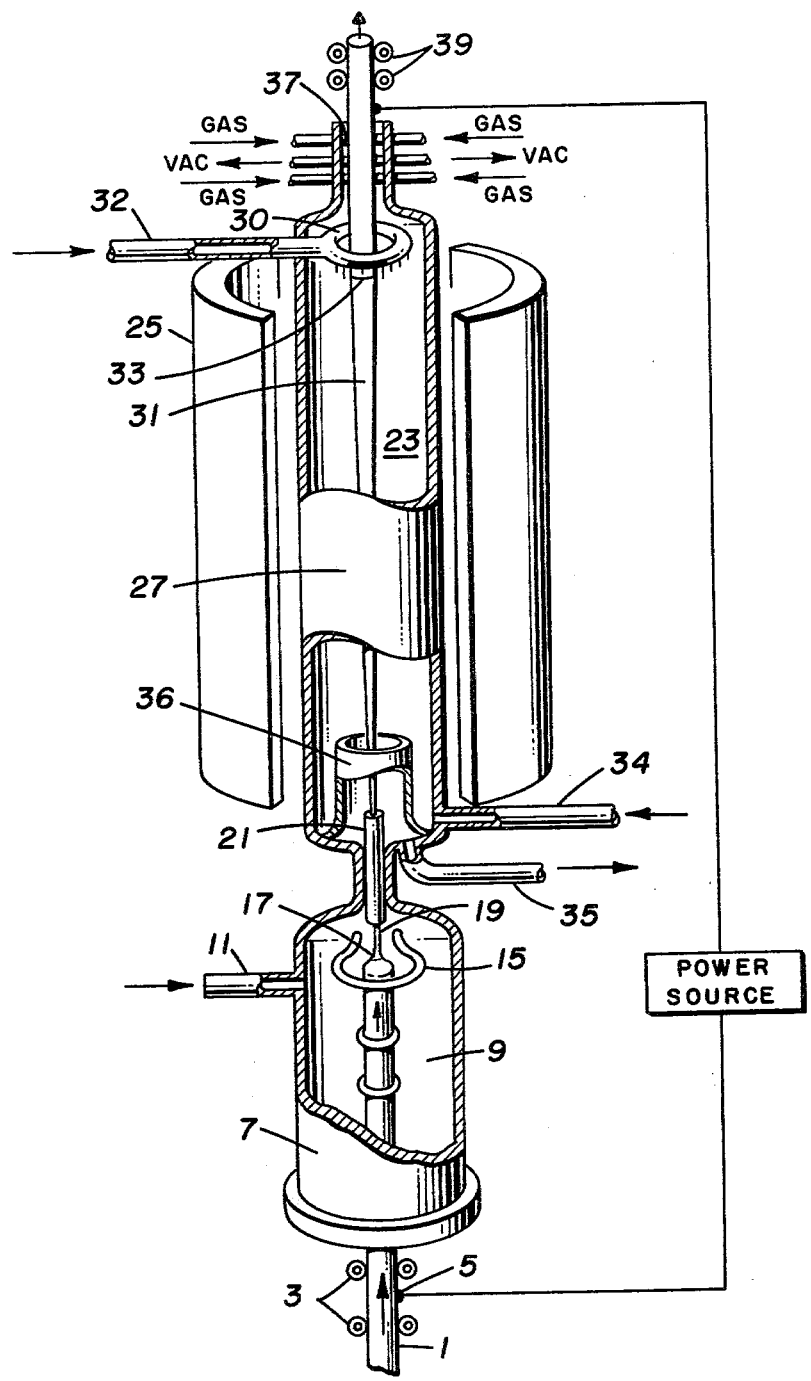

GAS CURTAIN CONTINUOUS CHEMICAL VAPOR DEPOSITION PRODUCTION OF SEMICONDUCTOR BODIES

BACKGROUND OF THE INVENTION

This invention relates to an apparatus and process for continuously growing semiconductor bodies resulting from chemical vapor deposition upon in situ produced seed rod. In another aspect the invention relates to the continuous deposition of single crystal semiconductor bodies from continuously pulled virgin slim rods formed in situ, heating of the slim rods to temperatures which provide suitable surface conditions for contacting selected thermally decomposable gaseous compounds in a chemical vapor deposition chamber having a gas curtain along the inner wall, followed by removal of the resulting single crystal semiconductor body from the chamber.

In the semiconductor industry, it is common to deposit material from the gaseous state onto a substrate for the purpose of forming various electronic devices. In some applications the material deposition from the gas is the same material as that from which the substrate is formed, while in other instances it is a different material from that from which the substrate is formed. As an example of the former, in the growth of silicon by vapor deposition techniques, it is common to position an elongated silicon filament between two graphite electrodes each of which extends through the end of a quartz container within which the filament is placed. A potential is impressed across the graphite electrodes causing a current to flow through the filament. The resistance of the filament to current flow elevates the temperature of the filament to a temperature generally in excess of about 1100° centigrade.

A gas stream, which comprises a mixture of trichlorosilane and hydrogen and/or other silanes is introduced into the quartz chamber and after flowing along the longitudinal axis of the filament is withdrawn from the chamber. The gas stream, upon contacting the hot surface silicon filament, will react to deposit polycrystalline silicon on the filament, thus increasing the diameter of the filament. The reaction of the trichlorosilane and hydrogen may be generally illustrated by the following simplified formula:

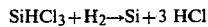

$$SiHCl_3 + H_2 \rightarrow Si + 3\ HCl$$

Gas flow through the quartz cylinder or reaction chamber is usually continued for several hours to increase the diameter of the filament, which may be one-tenth inch in diameter upon commencement of the deposition, to the diameter in excess of five inches. When the silicon rod has reached a desired diameter, the flow is terminated and the rod is removed from the reaction chamber. Material deposited on the silicon filament will be polycrystalline and therefore must be zone melted to produce a single crystalline material. Alternatively, the poly crystal rod may be melted in a crucible and a large single rod is "pulled" from the melt by way of a variety of apparatus such as a "Czochralski" puller.

In both commercially accepted methods of producing single crystal silicon for the electronics industry, that is by float zone or by Czochralski, the single crystal rod which is drawn from a melt in both cases is rotated and results from the pulling of the melt in the form of the single crystal rod. Such methods require considerable skilled technician monitoring as well as multiple furnaces requiring substantial energy for operation. Even under the best conditions, frequently the crystal is lost during the first stage which means that the rod being pulled converts to a polysilicon growth zone; thus terminating the growth procedure of the rod. Such commercial methods of producing remelt single crystal silicon rod materials is costly in time and effort and frequently produce irregularly shaped cylindrical rods requiring substantial premachining before slicing and conversion into wafers for use in the electronics industry.

Recent developments in the semiconductor industry have created a growing demand for low-cost single crystal silicon of extremely high purity, which is known as semiconductor grade silicon. Semiconductor grade silicon is used in the manufacture of semiconductor devices, such as transistors, rectifiers, solar cells, and the like. Processes are in use in the prior art producing single crystal silicon through the remelting of polycrystalline semiconductor grade silicon.

The prior art processes have demonstrated the technical and economic feasibility of producing high purity polycrystalline silicon of semiconductor quality by hydrogen reduction of silicon halides. All commercial semiconductor polycrystalline silicon presently being manufactured through chemical vapor deposition processes employ hydrogen reduction of dichlorosilane or trichlorosilane and the deposition of silicon on electrically heated silicon filament substrate.

This method relates to a method for producing high purity silicon or other semiconductor materials primarily for semiconductor device use and, in particular, to an improvement of the Siemens' process as described by Gutsche, Reuschel, and Schweickert in U.S. Pat. No. 3,011,877 and by Gutsche in U.S. Pat. No. 3,042,497. According to these prior art patents, elemental silicon is obtained in the form of cylindrical rods of high purity by decomposing silicon halides from the gas phase at a hot surface of the purified silicon filament, the preferred halides being the chlorides, silicon tetrachloride and silicon trichloride. These compounds become increasingly unstable at temperatures above 800° C. and decompose in two ways: (1) After adsorption on a hot surface which can provide a substrate for heterogeneous nucleation, for example, when the silicon halide concentration in the gas phase is kept relatively low by adding hydrogen as a diluent, the hydrogen also acts as a reducing agent; (2) in the case of high halide concentration in the gas phase, homogeneous nucleation occurs and the resulting silicon forms a dust of extremely fine particle size which is unsuitable for further processing. Heterogeneous nucleation hence silicon deposition starts at about 800° C. and extends to the melting point of silicon at 1420° C. Since the deposition is beneficial only on the substrate, the inner walls of the decomposition chamber must not reach temperatures near 800° C.

On the other hand, the deposition chamber wall temperature must not be much lower than about 500° C. because a cold wall is an effective heatsink and can easily overtax the ability of the electronic current passage through the substrate filament to maintain the 1150° to 1200° C. surface temperature needed to have the desired deposition on the filament. Increasing the current through the substrate is not possible as a consequence of the negative temperature coefficient of resistivity in silicon which causes the electronic current to flow preferentially through the center of the cross section of the filament creating and maintaining thus an overheated core. Filaments with surface temperatures of over 1300° C. for example, have usually a molten core. As one embodiment of U.S. Pat. No. 3,042,497 describes, the wall temperature can be effectively controlled by varying the amount and speed of the air circulation over the outside of the decomposition chamber. However, as the deposition progresses, the filament grows into rods of great weight, diameter and surface area which gives off radiant energy at least 10% of which is absorbed by the quartz wall where the wall is absolutely clear. Much more energy is absorbed when the quartz does not transmit readily because of flaws within the quartz wall or just a general roughness of the quartz surface. Experience has indicated that the cooling air alone cannot satisfactorily solve the overall needs of silicon chemical decomposition chambers.

Epitaxially grown single crystal silicon by chemical vapor deposition (CVD) has been known since the early 1960's. It is also known to utilize volatile acceptor or donor impurity precursors during growth processing of silicon; thus leading to the formation electricallyactive regions, bounded by junctions of varying thicknesses, carrier concentrations, and junction profiles. Vapor substrate growth systems are quite general and in principle applicable to systems in which are provided pertinent kinetic and thermodynamic conditions of satisfactory balance.

The growth of single crystal silicon from the vapor phase is dependent on several important parameters, all of which interreact with each other to some degree. These parameters can be described in part, for example, as substrate surface crystalographic orientation, the chemical system, reaction variables, such as concentration, pressure, temperature modification, and the appropriate kinetic and thermodynamic factors. A variety of reaction systems have been investigated; however, all have the common feature that a hot single crystal surface is exposed to an atmosphere which is thermal and/or chemical interreaction is capable of producing silicon atoms on a hot surface. The mechanism of the silicon-forming reaction is a function of the temperature of the substrate.

In addition to known CVD epitaxially-grown silicon, epitaxial CVD processes using trichlorosilane have been demonstrated to achieve conversion yields of 50% or better and that single crystal deposition does occur at linear growth rates. It is further known that p-n junctions with theoretical I-V characteristics have been grown by CVD indicating the superiority of CVD crystal silicon over melt grown silicon. However, practical application of chemical vapor deposition to the preparation of single crystal semiconductor bodies has not been extended to the preparation of rod shaped bodies but has been limited to the preparation of thin epitaxial films on substrate in wafer form. All attempts at preparing thick, i.e. more than a few thousandths of an inch single crystal bodies, have failed because of the unavailability of adequate methods to provide and/or maintain an absolutely contamination-free surface on the substrate seed and other mechanical-chemical problems. Similarly, all attempts at preparing rod shaped bulk single crystal bodies on electrically heated single crystal filaments consisting of the same material have failed, mainly because of the unresolved difficulties with preparing and maintaining an absolutely contamination-free substrate seed surface. In addition all previous attempts at developing processes for the direct deposition of rod-shaped single crystal bodies, energy applications have failed since direct electrical means were insufficient to provide the temperature uniformity essential to deposit a flawless single crystal body of homogeneous composition. Both a perfect single crystal structure and homogeneous chemical composition are conditions without which a semiconductor device constructed by means of that single crystal body will not function properly.

SUMMARY OF THE INVENTION

To overcome the difficulties cited above, the invention provides a process and apparatus for preparing electronic grade semiconductor bodies from continuously pulled slim rod formed in situ from the reaction of a seed crystal and a molten semiconductor material source, pulled into and through a chemical vapor deposition chamber having an internal gas curtain directed along the chamber walls. The invention is predicated upon the use of an interior cooled wall curtain or cooling chamber walls as well as prohibiting reactor gas from making contact with the chamber walls. Rather than use of an external gas such as air to regulate the chamber wall temperature, it is proposed to use part or all of the process gas to cool the inner wall directly; thus creating a fluid or gas curtain. Such an arrangement would not only provide effective cooling but could also preheat the process gas, thus reducing energy loss due to radiation, convection and conduction which occurs through an externally cooled chamber wall.

The in situ produced seed rod which is continuously drawn into and through the chemical vapor deposition chamber, heated before entry into the chamber, and simultaneously exposed to further heating and selected thermally decomposable gaseous compounds resulting in deposition growth of the body while the apparatus and methodology of the invention substantially prohibits unwanted thermal deposition upon the inner chamber walls.

The high speed gas flow along the inner wall provides an effective gas curtain which prevents reactive gas from reaching the chamber wall surface; thus avoiding deposits on the wall. This consideration should prove particularly useful in the case of silicon, when silane or mixtures of silicon halides with silane is used. Such mixtures of silane and silicon halides reach deposition temperatures at approximately 400° C. In either case using silicon halides or mixtures of silane and silicon halides, a fast well directed flow of process gas or hydrogen or inert gas taken from Group VIII A of the periodic chart along the decomposition chamber wall in the amounts needed for dilution of the silicon compound gases used, prevents silicon deposition on the walls.

In accordance with the principles of the invention, the CVD approach was directed to bulk single crystal operation. Such an approach would not only eliminate the need for melt processing but also has the potential for producing a much improved product. The present apparatus utilized in the standard Siemens' process decomposer employing two or more free-standing filaments or slim rods providing substrate surfaces is inappropriate for the present invention since this apparatus is unsuited for the purpose of growing single crystals. While in the epitaxial process, major emphasis is placed in providing temperatures as uniform as possible across each substrate as well as from "wafer-to-wafer", no such temperature control has been achieved in the case of silicon single crystal, i.e. also called hex rod production. As a consequence of the negative resistivity coefficient of silicon, all current heated silicon is hottest on the inside. Temperature differentials between the surface and the core of silicon bodies of as much as 120 degrees centigrade have been observed. The core begins to melt when the surface temperatures reach approximately 1300° C. Also the flat areas of "hex rods" are always hotter (10° to 50° C.) than the corners and the flat areas facing another rod can be 10 to 50 degrees hotter than the "flat" facing outside, i.e. the cooler decomposer wall. These large temperature gradients naturally lead to thermal stress and lineage arrangement of the excessive dislocation generation.

Chemical vapor deposition chambers whether according to the continuous CVD process of the present invention or the Siemens' type decomposer processes for producing polysilicon share a common problem, that is, wall deposition coatings. Such wall depositions are undesirable since coatings force abortion of the process run because wall coatings prevent measurement of substrate temperature in the case of Siemens' decomposers which is taken by optical pyrometer and in addition substantial deposits of silicon on the quartz decomposer wall tend to break the latter because of the difference in thermal expansion. Wall deposits are usually less dense than the filament deposits and tend to flaking. These flakes lodge on the filaments and result there in undesirable, irregular, sometimes dendritic growths which render the material unsuitable for further processing. Even thin wall coatings react with the quartz, actually etch quartz as shown on the following schematic.

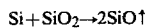

$$Si + SiO_2 \rightarrow 2SiO\uparrow$$

and strongly accelerate the devitrification of the fused quartz which then becomes opaque and must be at least partially remelted for the next run to clear up the crystallized layer. This is an interruptive and costly maintenance problem. By eliminating wall deposits through the present invention, a substantial improvement in the preparation of high purity silicon by continuous chemical vapor deposition can be achieved. The methodology and apparatus according to the invention or continuous chemical vapor deposition with silicon is even more sensitive to the requirements of an opaque chamber wall because of the focused external heating means utilized in one embodiment of the invention.

The starting slim rod surface in prior efforts is usually chemically etched, a condition which has been proven to be particularly poor for good epitaxial growth and all attempts to vapor etch the slim rod in hydrogen or hydrochloric acid did actually clean the decomposer inside which resulted in the deposition of varying impure "skins" on the slim rod. The initial deposit always showed a deep dip in resistivity as well as a tell-tale ring when cross sections were treated with preferential etches. This direct layer next to the original slim rod has always lead to what came to be believed "inevitable" chevron growth, i.e., stacking fault originated polycrystalline inserts in the otherwise single crystal "hex" rod. What is overcome by the present invention are the shortcomings mentioned in the two previous paragraphs by employing a continuous feed of slim rod which has an as-pulled, "virgin" surface into a tubular decomposer chamber. While slowly moving through the decomposer chamber, the slim rod is uniformly heated by focused heating means having a concentrated heat flux to the center line of the decomposer chamber which is also the center line of the slim rod and the growing semiconductor body. Part of the necessary heat will be supplied to the slim rod by passing a current through it, specifically during the preheat stage before the slim rod is introduced into the decomposer chamber.

The apparatus and process according to the invention produces electronic-grade semiconductor bodies, specifically the invention is directed in part to electronic-grade semiconductor single crystal materials, for example, silicon. Following the single crystal silicon aspect of the invention, a slim rod pulling chamber is provided wherein a virgin silicon slim rod is formed in situ from the reaction of the seed crystal and a molten silicon material source with the slim rod being pulled from the growth chamber through a communication zone of the growth chamber with a chemical vapor deposition chamber wherein the slim rod surface which has been preheated in the growth chamber is simultaneously exposed to focused heating and thermally decomposable silicon containing gaseous compounds. The apparatus according to the invention is designed specifically for single crystal growth as opposed to the Siemens' decomposer chambers as discussed hereinabove; therefore the apparatus according to the invention is directed to provide a virgin silicon slim rod under suitable conditions for producing the most desirable equilibrium reaction flow of the thermal decomposition of silicon containing gaseous compounds with the result of single crystal silicon being deposited and grown on the slim rod as the slim rod is continuously pulled through the chemical vapor deposition chamber. Single crystal silicon vapor deposition is a very complex process. The present invention has utilized apparatus and methods which are based upon identification and quantification of conditions necessary to produce excellent quality single crystal silicon as the result of intelligently controlling various variables in the process. Unlike much of today's methods in producing single crystal silicon, which depends in good part upon trial and error approaches, the present invention is based on the proper approach of qualifying conditions under which good single crystal silicon body can be produced through the direct thermal decomposition of elected silanes and halogenated silanes. Favorable silicon deposition conditions are greatly enhanced through the creation of a gas curtain along the chemical vapor deposition chamber inner wall substantially preventing the gaseous compounds, i.e. reaction gases from reaching the wall. In another aspect, cool reaction gas can be utilized as a curtain and recycled to the chamber at decomposition temperatures through an entry means along the center of the chamber and body.

BRIEF DESCRIPTION OF THE DRAWING

The drawing is an elevated somewhat schematic view of an apparatus useful in the practice of the invention wherein the gas curtain is provided along the walls of the continuous chemical vapor deposition chamber in the practice of the continuous process according to the invention.

DESCRIPTION OF THE PREFERRED EMBODIMENTS

The invention provides a process and apparatus for depositing semiconductor materials, such as elemental silicon, from a reaction gas capable of pyrolytically depositing the semiconductor materials on a heated, in situ drawn virgin seed rod under conditions which promote single crystal deposition rates allowing for continuous drawing of the rod through the chemical vapor deposition chamber. A significant deposition rate enhancement occurs through the utilization of a gas curtain along the chemical vapor deposition chamber inner walls which cools the walls while substantially prohibiting contact with the walls of the incoming hot reaction gases, i.e. silane and/or halogenated silanes which under the forced equilibrium conditions would deposit on the walls or flake. The requirement of having transparent clean walls according to the method of the invention, is critical in one embodiment wherein externally focused heat through the transparent walls is necessary in order to achieve controlled continuous chemical vapor deposition upon the growing silicon rod.

The thermodynamics of a silicon-chlorine-hydrogen system are generally understood. The equilibrium compositions are fully quantified; however, the kinetics of silicon chemical vapor deposition (CVD) are very poorly understood and multiple reactions appear to occur. Quantitatively, it is known that the deposition rate rises first rapidly with temperature, is thereafter less sensitive to temperature at high temperatures and may even drop with further increase in temperature within the upper limits. Mass transfer and heat transfer in silicon CVD systems utilizing radiant heating have not previously been well understood and continue to be evasive of exact quantification. Due to the complexity of the CVD process two specific goals were necessarily resolved through the invention, that is, high direct deposition rates while avoiding wall deposition.

The single crystal silicon chemical vapor deposition process according to the invention can be simply described as growth of a single crystal from a mixture of gases containing silicon such as halogenated silanes and/or silane and hydrogen at elevated temperatures. Behind this simple description a number of complex phenomena remain for the most part unresolved. Chemical thermal dynamics establishes the maximum attainable yields which depends on temperature and initial molar ratios. Various gas phase and gas/solid reactions are involved, the kinetics of which depend on temperature, gas composition, and crystal orientation. Absorption-desorption of reaction end products on crystal surfaces is also temperature dependent as are the rates of and crystal growth nucleation. Finally, the gas composition and temperature on the crystal surface are affected by the flow pattern in the reactor which determines mass transport and heat transfer.

In the following description of the invention, the process will be described on the basis of producing elemental, single crystal silicon from a reaction gas mixture, comprised of hydrogen, silanes, and/or halogenated silanes, preferably trichlorosilane. However, this is for convenience only and the invention may also be practiced with other thermally decomposable semiconductor compounds capable of yielding selected semiconductor materials. For silicon sources such as tetrachlorosilane, tetrabromosilane, tribromosilane, for example, as well as other suitable thermally decomposable compounds may be used.

The term "continuous" as used herein and in the claims is defined as the pulling of an in situ virgin slim rod from the pulling chamber directly into and through the chemical deposition chamber whether the pulling is absolutely continuous or in stop and go motion. The concept "continuous" as defined herein is to illustrate the fact that the semiconductor bodies are produced on a virgin slim rod fashioned continuously and moved through the chemical vapor deposition chamber without break in the production scheme, with finished product being drawn from the chemical vapor deposition chamber either into the upper chamber storage area or into the atmosphere where it can be scribed and broken or sawed and removed from the continuously produced rod. The process according to the invention can be continuous in motion or can be continuous with intermittent motion through the respective chambers. In another aspect the continuous process can be defined as drawing the seed rod into and through the chemical vapor deposition chamber with a period of stop motion for growth of the semiconductor body and thereafter removing that rod segment from the chemical vapor deposition chamber which simultaneously loads the chamber with new virgin seed rod.

The in situ produced virgin slim rod or seed rod can be the result of a seed float-zone or Czochralski silicon melt source which is made available in the pulling chamber. In the case of float-zone, the continuous supply rod can be fed through the bottom portion of the pulling chamber in a continuous mode depending upon the requirements for seed rod production as the seed rod is pulled into and through the chemical vapor deposition chamber. In addition the slim rod is heated prior to entry into the chemical vapor deposition chamber and its pathway is clearly defined through a sleeve mechanism which is of sufficient diameter to allow the slim rod to pass therethrough without touching. The restrictive nature of the sleeve and communication passageway between the pulling chamber and the chemical vapor deposition chamber permits open communication for passage of the slim rod; however, it does not permit substantial gas transfer between the two chambers. According to the invention a positive pressure exists in the pulling chamber which comprises hydrogen or helium or some other suitable inert gas which will not interfere with the reaction gas thermal decomposition process of the CVD chamber. This positive pressure permits, for example, hydrogen to enter into the CVD chamber in very small amounts which will not interfere with the reaction gas thermodynamics or kinetics of depositing silicon upon the heated slim rod.

The pulling of a virgin silicon slim rod of single crystal composition is necessary in order to insure elimination of many of the causes for poly growth in a CVD chamber. For example, initially, commercially pulled single crystal slim rods, or chemically etched or prepared by other known methods, have been found to contain sufficient surface contamination or defect problems which lead to substantial poly formation upon the decomposition of the reaction gases in the CVD chamber. It should be noted however that according to the invention that the process and apparatus as presented can always be utilized for the production of polycrystalline silicon if that result is desired. In fact, it may be highly desirable for the following reasons. The present poly requirement for removing the slim rod or filament from an external slim rod puller to the reaction chamber thereby exposing the virgin surface of the slim rod to handling in an atmospheric environment inevitably causes impurities from the environment as well as particular matter to be lodged in the form of an absorbed layer of the surface. From this surface neither the adsorbed atomic or molecular species nor the particulate matter can be removed completely by predeposition vapor etching. During the following deposition of silicon from the CVD reaction the first layer will therefore be impurity-rich and affected by numerous point defects which will cause polycrystalline growth in selected areas.

It follows therefore that in the traditional Siemens' process for the preparation of semiconductor grade polycrystal silicon in which externally prepared slim rods serve as substrate, there are always highly contaminated initial layers with trapped impurities which severely limit the potential of the Siemens' process to prepare ultimate degrees of purity of the product silicon. This means that the process and apparatus disclosed in this invention is also extremely useful in the preparation of polycrystalline silicon rod of superior purity, for example, as needed for float zone feed. The process and apparatus can also be utilized for a variety of semiconductor body production wherein the deposition material is acquired through thermal decomposition of gaseous compounds. The above described processes are particularly advantageous when applied to silicon. The method, however, is also applicable to other semiconductor substances which are required in extreme purity, and are preferred in monocrystalline form; for example, in the manufacture of electronic semiconductor devices such as rectifiers, transistors, solar cells, photo cells, and the like. The method is suited to the production of highly purified germanium, and semiconducting compounds of elements from the third and fifth groups of the periodic system to form such compounds as BN, BP, BAs, BSb, AlN, AlP, AlAs, AlSb, GaP, GaAs, GaSb, InN, InP, InAs, InSb, and the like. The process is also utilizable for the meltless production of other desirable substances particularly metals and metals compounds having high melting points.

Once the virgin slim rod which has been preheated and drawn into and through the CVD chamber the rod is simultaneously exposed to focused heating and in the case of silicon, silicon-containing decomposable gaseous compounds. The CVD chamber is arranged in such a manner as to afford continuous focused heating in a geometrical manner on the rod for substantially the entire length of the chamber. The method of heating has to provide sufficient energy to maintain the substrate surface temperature between 1000° C. and 1300° C., preferably 1500° C.–1250° C., at all times and has to provide sufficiently uniform heating to the substrate so that the surface temperature does not vary more than about ±10° C., preferably ±5° C., or less, along the entire deposition area.

Various gas feed arrangements can be utilized in the CVD chamber with one preferred embodiment inclusive of a countercurrent flow of reaction gas as opposed to the continuous movement of the slim rod and/or growing body. The process according to the invention does not require rotation of the slim rod or of the drawing body which is generally the case of modern remelt methods; however, if desired, rotation of the growing body could be utilized according to the invention when, for example, an improvement of deposition uniformity is desired.

In the continuous process and apparatus for producing semiconductor bodies from slim rod through the utilization of a CVD chamber, the withdrawal of the grown body or of silicon hex rod can be achieved by various means. One suitable means is through a gas lock which incorporates movement of the hexagonal body to a restricted zone wherein it first contacts one reactive gas jet thereafter followed by contact with a vacuum zone and thirdly an inert gas jet. These various gas-vacuum zones can be repeated, the number according to the need. Such gas seal means are achievable because of the relatively low pressure of the reaction gas system within CVD reaction chamber. The gas seal means also permits various shaped articles, i.e. cylindrical, irregular shaped cylindrical and hexagonal configurations to pass through a restricted mechanical barrier without touching the barrier. In addition, these gas seal means zones can be utilized for initial cooling of the growth body as it leaves the reaction chamber and enters into atmospheric conditions or storage conditions. Once the growth body has been drawn for a distance somewhat removed from the CVD chamber and gas seal means in the atmosphere, the body can be scribed, snapped, broken or sawed from the continuously pulled growth body source, the separation depending on temperature of the growth body at the point of separation and lack of mechanical shock to the continuously growing body system.

In another embodiment of the invention, the growth body is pulled from the CVD chamber through a mechanically restricted zone which permits withdrawal of the body without touching the walls of said zone with the body being drawn into an expansion chamber comprised of, for example, a bellows expansion chamber which permits the growth body to achieve various lengths outside the CVD chamber depending upon the length of the bellows apparatus. One advantage of such a system permits the cool down of the rod to be achieved in controlled atmospheric conditions. The bellows would necessitate eventual temporary shutdown of the continuous process; however, such shutdown would not necessarily contaminate the system for restart achieved by thermal build up and reaction gas introduction to the CVD chamber after an inert gas purge. Here again the CVD chamber is at a relatively low pressure during operation and positive pressure can be maintained between the CVD chamber and the bellows reception chamber during continuous growth and during shutdown removal of the grown body.

In another version of the slim rod puller, reaction chamber, bellows storage chamber assembly, a gas seal means could be provided between the deposition chamber and the bellows storage chamber thus eliminating the need for any interruption of the deposition process during removal of the product rod from the bellows storage chamber.

Before discussing the various apparatus illustrated in the drawings which are useful for practicing the invention, it is to be noted that a main feature of the invention is to allow one to select specific deposition rates at an optimum value and to maintain this value during the entire deposition process in a continuous mode. In that regard, it is desirable to select the deposition rate as large as possible, but in so doing to also insure that neither homogeneous nucleation of, for example, silicon, in the free gas phase nor deposition of silicon on the interior walls of the CVD chamber occurs. In addition the utilization of a virgin silicon slim rod prepared in situ creates the best possible deposition surface for creating single crystal silicon bodies.

The preferred embodiments of the apparatus and process to be employed for the purpose of the invention are schematically illustrated in the drawing.

In the FIGURE, a source feed rod of polycrystalline silicon 1 having a direct current connection 5 is automatically fed through means 3 in through seal means 7 into the virgin seed rod pulling chamber 9. The direct current connection 5 is utilized for resistive preheating of the virgin seed rod or slim rod 19 before entry into the chemical vapor deposition chamber 23. The source rod seal means 7 can be of various constructions which allow longitudinal transport into a pressurized chamber. The slim rod pulling chamber 9 is equipped with chamber inlet gas facilities 11 which maintains a positive pressure upon the pulling chamber 9 utilizing, for example, hydrogen or helium or some other suitable gas which is inert to the thermal decomposition reactions which occur in the CVD chamber 23. Pulling chamber 9 may be vented by outlet means; however, the positive pressure should be maintained and the outlet can be through the quartz sleeve 21.

The source feed rod 1 provides a source rod melt 17 through utilization of a high energy heating coil 15, for example, similar to physical conditions utilized in commercial float zone technology. The virgin slim rod 19 is produced through the action of a single crystal seed and drawing of same from the source rod melt 17. The virgin slim rod 19 is continuously pulled from the pulling chamber 9 into and through the CVD chamber 23 through a communication zone between chambers 9 and 23 comprised of a quartz sleeve 21 which serves the purpose of reducing temperature loss of the CVD chamber and in combination with the positive pressure of the pulling chamber 9 prohibits process or reaction gas loss from CVD chamber 23. In addition, the quartz sleeve 21 in the restrictive communication zone between the two chambers prohibits contact of the seed rod 19 with the process gas in the CVD chamber 23 until ideal reaction conditions exist which occur upon entry into the CVD chamber 23 through the simultaneous focused heating from the radiant heat furnace 25 in combination with CVD chamber 23 transparent walls 27 and contacting of the slim rod 19 with process gas from inlets 32. The process gas inlets can be arranged in interior circular dispersion heads 30 which encompass the growth rod and can enter the CVD chamber 23 at various points along the chamber walls. The reaction gas inlet 32 can also be utilized in combination with tangential contact jets with the silicon body 31 wherein multiple reaction gas inlets 32 are utilized in combination along the length of chamber 23. Gas curtain inlets 34 can be arranged in various positions along the chamber walls 23 wherein the gas curtain is guided upon entry through flow guides 36. The gas curtain can be parallel to the flow of the reaction gas from, for example, the reaction feed head 30 or can be countercurrent to the reaction gas flow. A preferred embodiment is a countercurrent flow of the gas curtain to that of the reaction gas flow, the reaction gas being fed toward the center of the chamber 23 while the gas curtain is fed into and direct along the inner wall of chamber 23.

The resulting hexagonal silicon body 31 increases in diameter as it proceeds through the CVD chamber 23 reaching a maximum rod diameter 33 at the upper end portion of chamber 23. The continuous process and the apparatus according to the invention provide a gas seal means 37 at the upper end of chamber 23 which permits continuous drawing of the enlarged hexagonal body from the chamber without loss of process gas or contamination of the CVD chamber. The continuous motion of the seed rod and the growth rod is achieved through automatic rod pulling means 39 which are exterior to the CVD chamber 23.

Other embodiments of the invention which are not shown in the FIGURE would be the utilization of an expansion type bellows chamber affixed to the upper end of the chamber 23 which may or may not be in combination with a gas seal means 37.

In the following examples the invention is illustrated more fully with experimental data wherein no wall deposits of silicon were observed through the conditions as set out in the Table below. The process gases inclusive of hydrogen, tetrachlorosilane and trichlorosilane are indicated in units of liters per minute while a hydrogen blanket was used in the examples, also shown in liters per minute flow. The deposition rate in microns per minute is also included and varies accordingly with the variations and process gas content and hydrogen blanket flow.

TABLE

| Example No. | Process Gas (l/min.) | | | Hydrogen Blanket (l/min.) | Deposition Rate (microns/min.) |
|---|---|---|---|---|---|
| | $H_2$ | $SiCl_4$ | $SiHCl_3$ | | |
| 1 | 31.9 | 1.1 | — | 65 | 3.9 |
| 2 | 31.8 | 1.4 | — | 75 | 3.7 |
| 3 | 51.0 | 0.9 | 2.6 | 60 | 8.0 |
| 4 | 29.7 | — | 4.7 | 60 | 9.2 |

We claim:
1. A continuous process for preparing bodies of semiconductor materials comprising:
    (a) pulling a virgin slim rod in situ in a pulling chamber from the reaction of a seed crystal and molten semiconductor material source;
    (b) heating the slim rod to decomposition temperature of gaseous compounds containing suitable semiconductor materials for deposition upon the slim rod;
    (c) passing the heated slim rod into a chemical vapor deposition chamber;
    (d) maintaining the slim rod at a temperature sufficient for decomposing the gaseous compounds while contacting the slim rod with the decomposable gaseous compounds during the slim rod's transport through the chemical vapor deposition chamber;
    (e) creating a gas curtain along the chemical vapor deposition chamber inner wall substantially preventing the gaseous compounds from reaching the wall;
    (f) enlarging the slim rod as a result of thermal decomposition of the gaseous compounds; and
    (g) pulling the resulting enlarged semiconductor body from the deposition chamber.
2. The continuous process according to claim 1 wherein the slim rod upon entry into the chemical vapor deposition chamber and transport through the chamber is exposed to concentric, uniform heating through geometrically focusing heating means.
3. The continuous process according to claim 2 wherein the heating means is comprised of a radiant heat furnace surrounding the chamber and focusing the heat onto the slim rod through transparent walls of the chamber.

4. The continuous process according to claim 2 wherein the slim rod is simultaneously exposed to the focusing heating means and the decomposable gaseous compounds.

5. The continuous process according to claim 1 wherein the gas curtain is selected from the group consisting of hydrogen, helium, neon, argon, krypton, xenon and randon.

6. The continuous process according to claim 1 wherein the gas curtain is comprised of a hydrogen curtain and the curtain is introduced countercurrent to the decomposable gaseous compounds.

7. The continuous process according to claim 1 wherein a positive pressure is maintained between the slim rod pulling chamber and the chemical vapor deposition chamber, the positive pressure creating a gas flow from the pulling chamber into the chemical vapor deposition chamber.

8. The continuous process according to claim 1 wherein the pulling chamber is provided a continuous semiconductor materials source thus providing a continuous slim rod source for the chemical vapor deposition chamber.

9. The process according to claim 1 wherein the continuous movement of the slim rod into and through the chemical vapor deposition chamber is countercurrent to the decomposable gaseous compound flow.

10. The continuous process according to claim 1 wherein the resulting enlarged semiconductor body exits the chemical vapor deposition chamber through an exit means which provide cooling of the semiconductor body before entry into atmosphere storage zones.

11. The continuous process according to claim 1 wherein the enlarged semiconductor body exits from the chemical vapor deposition chamber into an expandable chamber zone which is in communication with a chemical vapor deposition chamber.

12. A continuous process for preparing bodies of semiconductor material comprising:
(a) pulling a virgin slim rod in situ in a pulling chamber from the float zone reaction of a seed crystal and molten semiconductor materials source, the material source being continuously supplied;
(b) heating the slim rod to decomposition temperature of gaseous compounds containing suitable semiconductor material for deposition upon the slim rod;
(c) passing the heated slim rod through a communication zone between the pulling chamber and the chemical vapor deposition chamber;
(d) maintaining the slim rod at a temperature sufficient for decomposing the gaseous compounds through focused radiant heat furnace means while contacting the slim rod countercurrently with the decomposable gaseous compounds;
(e) creating a gas curtain along the chemical vapor deposition chamber inner wall substantially preventing the gaseous compounds from reaching the wall;
(f) enlarging the slim rod diameter as a result of thermal decomposition of the gaseous compounds; and
(g) pulling the resulting enlarged semiconductor body from the deposition chamber through gas lock and cooling means.

13. A continuous process for preparing bodies of single crystal silicon comprising:
(a) pulling a virgin single crystal silicon slim rod in situ in a pulling chamber from the reaction of a seed crystal and a continuous source of molten silicon;
(b) heating the virgin slim rod to-decomposition temperature of gaseous silicon compounds which will thermally decompose upon the heated slim rod;
(c) passing the heated slim rod into a chemical vapor deposition chamber;
(d) maintaining surface temperatures of the rod, from about 1,000° C. to about 1,300° C. through heat focusing means;
(e) contacting the rod surfaces with a gas having the formula $Si_kH_mX_n$ where k is a number from 1 to 2, m is a number of from 0 to 6, n is a number of from 0 to 6 and X is a halogen;
(f) creating a gas curtain along the chemical vapor deposition chamber inner wall substantially preventing the gaseous compounds from reaching the wall;
(g) depositing silicon on the single crystal rod surfaces as the rod is moved through the chemical vapor deposition chamber; and
(h) withdrawing the resulting enlarged single crystal silicon body from the chemical vapor deposition chamber.

14. A continuous process according to claim 13 wherein the thermally decomposing silicon deposits upon the single crystal seed rod forming a single crystal structure.

15. A continuous process according to claim 13 wherein the thermally decomposing silicon deposits upon the single crystal seed rod forming a single crystal structure having hexagonal surfaces.

16. The continuous process according to claim 13 wherein the heated virgin slim rod is introduced into the chemical vapor deposition chamber and simultaneously exposed to focused heating and thermally decomposable gases of silicon containing compounds resulting in the decomposition of single crystal silicon having the orientation and crystal lattice structure of the seed rod.

17. The continuous process according to claim 13 wherein the gas curtain is comprised of a hydrogen curtain and the curtain is introduced countercurrent to the decomposable gaseous compounds.

18. A continuous process according to claim 13 wherein a positive pressure differential exists between the pulling chamber and the chemical vapor deposition chamber resulting in a positive gas flow from the pulling chamber to the chemical vapor deposition chamber.

19. The continuous process according to claim 18 wherein the gas forming the positive pressure from the pulling chamber to the chemical vapor deposition chamber is selected from the group consisting of hydrogen, helium, neon, argon, krypton, xenon and radon.

20. A continuous process according to claim 13 wherein the molten silicon source is continually supplied through float-zone means.

21. A continuous process according to claim 13 wherein the molten silicon source is continuously supplied through Czochralski means.

22. The continuous process according to claim 13 wherein the thermally decomposable silicon containing gaseous compounds are comprised of trichlorosilane.

23. A continuous process for preparing bodies of polysilicon comprising:

(a) pulling one or more virgin silicon slim rods in situ in a pulling chamber from the reaction of one or more seed crystals and a continuous source of molten silicon;
(b) preheating and introducing the silicon slim rods into a chemical vapor deposition chamber;
(c) simultaneously heating and contacting the introduced slim rods to decomposition temperature of silicon containing gaseous compounds;
(d) maintaining slim rods at a temperature sufficient for decomposing silicon containing gaseous compounds while passing slim rods through the chemical vapor deposition chamber;
(e) creating a gas curtain along the chemical vapor deposition chamber inner wall substantially preventing the gaseous compounds from reaching the wall;
(f) enlarging the slim rod's diameter as a result of thermal decomposition of the silicon containing gaseous compounds; and
(g) pulling the resulting enlarged polysilicon bodies from the chemical vapor deposition chamber.

24. Apparatus for continuous growth of semiconductor material bodies comprising:
(a) a slim rod growth chamber having an upper end in communication with the vapor deposition chamber lower end through a narrowed passageway of sufficient diameter to allow passage of the slim rod from the growth chamber into the chemical vapor deposition chamber without touching; the growth chamber in lower end communication with a continuous source of semiconductor feed rod which provides a melt source through high energy heating coil means;
(b) a withdrawable pulling means extending downward through the chemical vapor deposition chamber and into the growth chamber;
(c) growth chamber slim rod heating means;
(d) geometrically focusing radiant furnace surrounding the chemical vapor deposition chamber walls, the chamber walls being transparent to the focused heat;
(e) growth chamber entering gas pressure source means;
(f) reaction gas entering and exit means to the chemical vapor deposition chamber;
(g) gas entry flow guide means which provide a gas curtain along the chemical vapor deposition chamber inner wall substantially preventing the gaseous compounds from reaching the wall; and
(h) exit means from the chemical vapor deposition chamber upper end comprised of a gas seal means.

25. The apparatus contained in claim 24 wherein the narrowed passageway providing communication between the growth chamber and the chemical vapor deposition chamber is comprised of a quartz sleeve.

26. The apparatus according to claim 24 wherein the growth chamber slim rod heating means is comprised of resistive heating.

27. The apparatus according to claim 24 wherein the chemical vapor deposition chamber upper end is comprised of an expansion member permitting the semiconductor material body to be drawn upwardly from the chemical vapor deposition chamber.

28. The apparatus according to claim 24 wherein the gas curtain is introduced into the chemical vapor deposition chamber through at least one entry guide means countercurrent to the reaction gas entry which provides central chamber flow along the semiconductor body.

* * * * *